United States Patent [19]

Andersen

[11] Patent Number: 5,300,904
[45] Date of Patent: Apr. 5, 1994

[54] CIRCUIT ARRANGEMENT FOR THE TANK CIRCUIT OF A HIGH-FREQUENCY TRANSMITTER OUTPUT STAGE OPERATED WITH FREQUENCY SHIFT KEYING

[75] Inventor: Henning H. Andersen, Horsholm, Denmark

[73] Assignee: Topholm & Westermann ApS, Vaerloese, Denmark

[21] Appl. No.: 923,804

[22] PCT Filed: Mar. 2, 1991

[86] PCT No.: PCT/EP91/00391
§ 371 Date: Sep. 1, 1992
§ 102(e) Date: Sep. 1, 1992

[87] PCT Pub. No.: WO91/16762
PCT Pub. Date: Oct. 31, 1991

[30] Foreign Application Priority Data

Apr. 17, 1990 [DE] Fed. Rep. of Germany ....... 4012265

[51] Int. Cl.$^5$ ............................................. H03J 5/24
[52] U.S. Cl. ........................................ 334/55; 334/59; 375/63
[58] Field of Search ........................... 334/47, 55-60; 375/63; 455/120, 121

[56] References Cited

U.S. PATENT DOCUMENTS

| | | | |
|---|---|---|---|
| 1,658,718 | 2/1928 | Hardcastle | 334/55 |
| 1,768,433 | 8/1926 | Alexanderson . | |
| 2,085,403 | 6/1937 | Van Loon et al. | 334/58 X |
| 2,252,100 | 8/1941 | Spoor | 334/58 |
| 2,296,100 | 9/1942 | Foster et al. | 334/56 X |
| 2,325,174 | 7/1943 | Cooper | 334/47 |
| 2,538,439 | 1/1951 | Bedford et al. | 334/55 |
| 2,679,581 | 5/1954 | Jacob et al. | 375/63 X |
| 2,883,524 | 6/1953 | Deise et al. . | |
| 3,255,414 | 6/1966 | Kawalek et al. . | |
| 3,319,168 | 5/1967 | Olson . | |
| 3,395,351 | 7/1968 | Deise et al. . | |
| 3,939,422 | 2/1976 | Deise | 375/63 |

Primary Examiner—Paul Gensler
Attorney, Agent, or Firm—Sughrue, Mion, Zinn, Macpeak & Seas

[57] ABSTRACT

The invention concerns a circuit for the resonant cavity in a frequency-shift HF transmitter output stage, with a first capacitance (2), a first inductance (3) and a first switch (5) for feeding the HF signal to the resonant cavity. To switch the resonant cavity over to resonance with the other transmission frequency, additional capacitance (2a) can be switched in or out of the cavity by means of additional switch means (4).

4 Claims, 1 Drawing Sheet

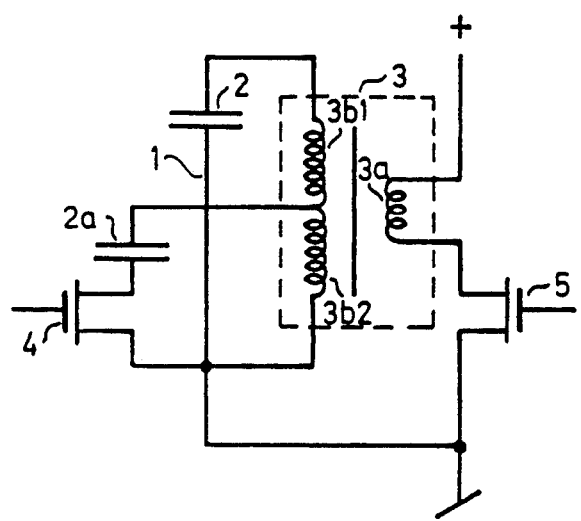

CIRCUIT ARRANGEMENT FOR THE TANK CIRCUIT OF A HIGH-FREQUENCY TRANSMITTER OUTPUT STAGE OPERATED WITH FREQUENCY SHIFT KEYING

FIELD OF INVENTION

The invention relates to a circuit arrangement for the tank circuit of a high-frequency transmitter output stage operated with frequency shift keying, equipped with a tank circuit capacitor, a tank circuit inductor and a feeder for supplying high-frequency energy to the tank circuit and with a switch for switching the tank circuit to resonance with the other transmission frequency in each case.

Such a circuit arrangement is known, for example, from US-A-3395 351.

In this circuit arrangement, the resonance frequency of the tank circuit is switched by switching an additional inductor connected in parallel to parts of the tank circuit inductor on or off, whereby the tank circuit inductor contains a transformer with a primary winding and secondary winding, whereby the number of turns of the primary winding is less than the number of turns of the secondary winding, whereby the output signals of the transmitter can be supplied to the primary winding and whereby switch-over of the tank circuit to the second resonance frequency always occurs when the first frequency is not present at the primary winding feeder.

This known, quite complex circuit arrangement is intended for a high-power, high-frequency transmitter operating with frequency shift keying where it is important to considerably reduce the control power required for switch-over of an inductor.

In addition, a circuit arrangement for remote control of toy cars is known from GB - A - 994 832, whereby this is located within an inductive wire loop which forms part of an oscillating circuit connected to a small transmitter. The oscillating circuit is completed by a number of capacitors, of which one can be optionally connected in each case. In other words, the resonance frequency of the oscillating circuit consisting of the inductive loop and only one capacitor in each case can be optionally switched to several different control frequencies for the toy cars.

In transmitters of the type mentioned above, it is of decisive importance that the transmitter efficiency is as high as possible, whereby this is also determined by the quality of the tank circuit, this representing the external resistance of the transmitter output stage.

As is known, such high-frequency transmitters are normally pulse-keyed with two different frequencies f1 and f2 for transmission of binary-coded signals, whereby the pulses of one frequency may represent binary "0", for example, and the pulses of the other frequency binary "1". Other types of pulse string representation are naturally also possible, as long as they consist of two different frequencies in this case.

SUMMARY OF INVENTION

The task of the invention is to safeguard optimum adaption of the output circuit or tank circuit for both frequencies during frequency shift keying operation for transmitter output stages of the type mentioned above.

This is achieved by the invention in the manner described in patent claim 1. Reference should be made to the other patent claims for further embodiments of the invention.

The invention will now be described in more detail on the basis of an example embodiment in schematic form in conjunction with the enclosed drawing.

BRIEF DESCRIPTION OF DRAWING

The schematic diagram shows a tank circuit, i.e. an output circuit of a high-frequency transmitter output stage, as could be used, for example, for remote control of models or similar.

DESCRIPTION OF PREFERRED EMBODIMENT

Transmitters of this type generally possess a very low power rating, so that high efficiency is crucial.

For the purpose of explanation, the transmitter will be operated as a transmitter with frequency shift keying between two frequencies f1 and f2 and be described as such. The signals are high-frequency signals whose frequencies should be located at around 150 kHz, for example, i.e. in the longwave band. This naturally does not represent any restriction of the invention concept and frequencies can be selected corresponding to the frequency bands available for the respective purpose.

A circuit arrangement suitable for this purpose is shown schematically by the enclosed FIGURE. A tank circuit 1 essentially consists of a capacitor 2 and an inductor 3, which in this case consists of transformer with a primary winding 3a and a secondary winding with two winding sections 3b1 and 3b2. The transmission energy, i.e. the signals to be transmitted, is supplied to the primary winding 3a via a first switch 5, which is located between the common base point of the circuit and the primary winding 3a. This switch is preferably a field-effect transistor which is controlled with the output signals of the transmitter at its gate electrode, while its source-drain connection is located between the common base point of the circuit and the primary winding 3a, which is connected to the positive terminal of a power source at its other end.

An additional capacitor 2a is connected to the tap of the secondary winding. The second switch 4, which serves to connect the additional capacitor 2a to and disconnect it from part of the oscillating circuit inductor, whereby the former is also preferably a field-effect transistor, is connected with its source-drain connection between the common base point of the circuit and the additional capacitor 2a. With respect to connection or disconnection of the additional capacitor in parallel to part of the oscillating circuit inductor, this switch is controlled at its gate electrode in such a way that the switch is always closed when the first of the two transmission frequencies is not present at the first switch 5, whereby the tank circuit is switched to the second resonance frequency.

It must, however, be noted that the voltages occurring at the secondary winding may easily reach a level of more than 100 V, depending on the ratio of the transformer 3. This could lead to practical difficulties, since most field-effect transistors cannot withstand such voltages. By suitable selection of the transformation ratio and the size of the additional capacitor 2a, it is possible to ensure that a correspondingly lower voltage is present at the field-effect transistor forming switch 4 which cannot lead to difficulties.

In the example described here, the capacitance of capacitor 2a is normally rather less than the capacitance of capacitor 2. However, if a slightly higher capacitance is chosen for the additional capacitor 2a and the latter is connected to the tap as well as the field-effect transistor functioning as switch 4, then a considerably lower voltage is present at this field-effect transistor which cannot lead to difficulties. The turn ratio for the primary and secondary windings may be between 1:10 and 1:100 for an actually realized circuit. The capacitance values for the capacitor 2 and 2a lie in the single-digit nanofarad range. In the case of very small transmitters for remote control of devices, the tank circuit can be realized extremely compactly by winding the primary and secondary windings of the transformer onto a ferrite core, which then simultaneously acts as an antenna.

I claim:

1. Circuit arrangement for the tank circuit (1) of a high-frequency transmitter output stage operated with frequency shift keying between a first and second frequency ($f_1$), equipped with a tank circuit capacitor (2) and a circuit inductor (3) and with a first switch (5) for supplying high-frequency energy to the tank circuit, as well as with a second switch (4) for switching the tank circuit to resonance with one of the transmission frequencies (f1, f2) in each case by connecting an additional capacitor to parts of the tank circuit inductor, the latter consisting of a transformer (3) with a primary winding (3a) and a secondary winding the number of turns of the primary winding being less than the number of turns of the secondary winding, the output signals of the transmitter being supplied to the primary winding and switch-over of the tank circuit to the second resonance frequency occurring when the first frequency is not present at the feeder to the primary winding, the secondary winding of the transformer (3) consisting of two winding sections (3b1, 3b2) with an intermediate tap, at which the additional capacitor (2a) is connected, and the second switch (4) being connected between the additional capacitor (2a) and a common base point of the tank circuit so that the additional capacitor (2a) is connected in parallel with only a part (3b2) of the secondary winding when the second switch (4) is closed.

2. Circuit arrangement in accordance with claim 1, characterized in that field-effect transistors are provided as the second switch (4) and first switch (5), whereby the output signals of the transmitter are supplied to the gate electrode of the first switch (5), whose source-drain connection is located between the common base point of the tank circuit and the primary winding (3a), whose other end is connected to a positive power source, while the source-drain channel of the second switch (4), which can be controlled at its gate electrode, is located between the common base point of the tank circuit and the additional capacitor connected at the tap of the secondary winding (3b1, 3b2).

3. Circuit arrangement in accordance with claim I, characterized in that the turn ratio of the primary winding to secondary winding is around 1:10 to 1:100.

4. Circuit arrangement in accordance with claim 1, characterized in that the windings (3a, 3b1, 3b2) of the transformer are wound onto a ferrite core, which acts as the actual antenna of the transmitter.

* * * * *